United States Patent
Tashiro et al.

(10) Patent No.: US 7,595,488 B2
(45) Date of Patent: Sep. 29, 2009

(54) METHOD AND APPARATUS FOR SPECIFYING WORKING POSITION ON A SAMPLE AND METHOD OF WORKING THE SAMPLE

(75) Inventors: Junichi Tashiro, Chiba (JP); Yutaka Ikku, Chiba (JP); Makoto Sato, Chiba (JP)

(73) Assignee: SII Nano Technology Inc. (JP)

( * ) Notice: Subject to any disclaimer, the term of this patent is extended or adjusted under 35 U.S.C. 154(b) by 180 days.

(21) Appl. No.: 11/313,326

(22) Filed: Dec. 21, 2005

(65) Prior Publication Data

US 2006/0138341 A1    Jun. 29, 2006

(30) Foreign Application Priority Data

Dec. 24, 2004    (JP)    ............................. 2004-373916

(51) Int. Cl.
*H01J 37/26*    (2006.01)
*H01J 3/14*    (2006.01)
*G21K 7/00*    (2006.01)
*G01N 23/00*    (2006.01)

(52) U.S. Cl. ..................... 250/307; 250/306; 250/491.1; 250/492.2; 702/31; 702/32; 702/36; 707/102; 707/104.1; 382/180

(58) Field of Classification Search .................. 250/306, 250/307, 309–311, 396 R, 397, 398, 400, 250/492.1, 492.2, 492.3; 707/100–102, 103 R, 707/103 Z, 104.1; 702/31, 35, 36; 382/180
See application file for complete search history.

(56) References Cited

U.S. PATENT DOCUMENTS

| | | | | |
|---|---|---|---|---|
| 4,590,569 A | * | 5/1986 | Rogoff et al. ................ | 701/219 |
| 5,153,434 A | * | 10/1992 | Yajima et al. ............... | 250/311 |
| 5,214,282 A | * | 5/1993 | Yamaguchi et al. ........... | 850/16 |
| 5,333,495 A | * | 8/1994 | Yamaguchi et al. ........... | 73/105 |
| 5,412,210 A | * | 5/1995 | Todokoro et al. .............. | 850/9 |
| 5,600,734 A | * | 2/1997 | Okubo et al. ................ | 382/147 |
| 5,660,176 A | * | 8/1997 | Iliff ............................ | 600/300 |
| 5,731,228 A | * | 3/1998 | Endo et al. .................... | 438/20 |
| 5,826,213 A | * | 10/1998 | Kennefick .................... | 702/35 |

(Continued)

*Primary Examiner*—Bernard E Souw
(74) *Attorney, Agent, or Firm*—Adams & Wilks

(57) ABSTRACT

Techniques for specifying an observing or working position of a sample are provided. Digitized data of a sample is obtained and stored in a 1st storage device. A 1st display area displays an image of a portion containing a desired observing or working position of the digitized data stored in the 1st storage device. A 1st position that is indicated by a pointing device on the 1st display area is stored in a 2nd storage device. The sample is moved to an observing or working position for observation, and an observation image of the sample is stored in the 3rd storage device. A 2nd display area displays the observation image of the sample stored in the 3rd storage device. A position indicated on the 2nd display area and corresponding to the 1st position stored in the 2nd storage device is stored in a 4th storage device. A conversion function for converting a coordinate system of the 1st display area and the 2nd display area is calculated using the 1st position stored in the 2nd storage means and the position stored in the 4th storage device. A position indicated in one of the 1st and 2nd display areas and corresponding to another position indicated in the other of the 1st and 2nd display areas is calculated in accordance with the calculated conversion function.

20 Claims, 6 Drawing Sheets

U.S. PATENT DOCUMENTS

| | | | |
|---|---|---|---|
| 5,851,183 A * | 12/1998 | Bucholz | 600/425 |
| 6,022,315 A * | 2/2000 | Iliff | 600/300 |
| 6,206,829 B1 * | 3/2001 | Iliff | 600/300 |
| 6,215,121 B1 * | 4/2001 | Fujihira et al. | 250/306 |
| 6,272,235 B1 * | 8/2001 | Bacus et al. | 382/133 |
| 6,463,319 B1 * | 10/2002 | Bucholz | 600/426 |
| 6,482,156 B2 * | 11/2002 | Iliff | 600/300 |
| 6,542,830 B1 * | 4/2003 | Mizuno et al. | 702/35 |
| 6,678,545 B2 * | 1/2004 | Bucholz | 600/426 |
| 6,706,465 B1 * | 3/2004 | Sano | 430/320 |
| 6,757,621 B2 * | 6/2004 | Mizuno et al. | 702/35 |
| 6,775,402 B2 * | 8/2004 | Bacus et al. | 382/133 |
| 6,849,045 B2 * | 2/2005 | Iliff | 600/300 |
| 7,146,372 B2 * | 12/2006 | Bacus et al. | 707/100 |
| 7,277,891 B2 * | 10/2007 | Howard et al. | 707/100 |
| 7,306,560 B2 * | 12/2007 | Iliff | 600/300 |
| 7,423,266 B2 * | 9/2008 | Tashiro et al. | 250/310 |
| 2005/0041861 A1 * | 2/2005 | Olschewski | 382/180 |
| 2005/0049799 A1 * | 3/2005 | Routburg et al. | 702/31 |
| 2005/0105790 A1 * | 5/2005 | Yasutomi et al. | 382/144 |
| 2006/0138341 A1 * | 6/2006 | Tashiro et al. | 250/396 R |
| 2006/0192118 A1 * | 8/2006 | Tashiro et al. | 250/310 |
| 2008/0302961 A1 * | 12/2008 | Tashiro et al. | 250/310 |

* cited by examiner

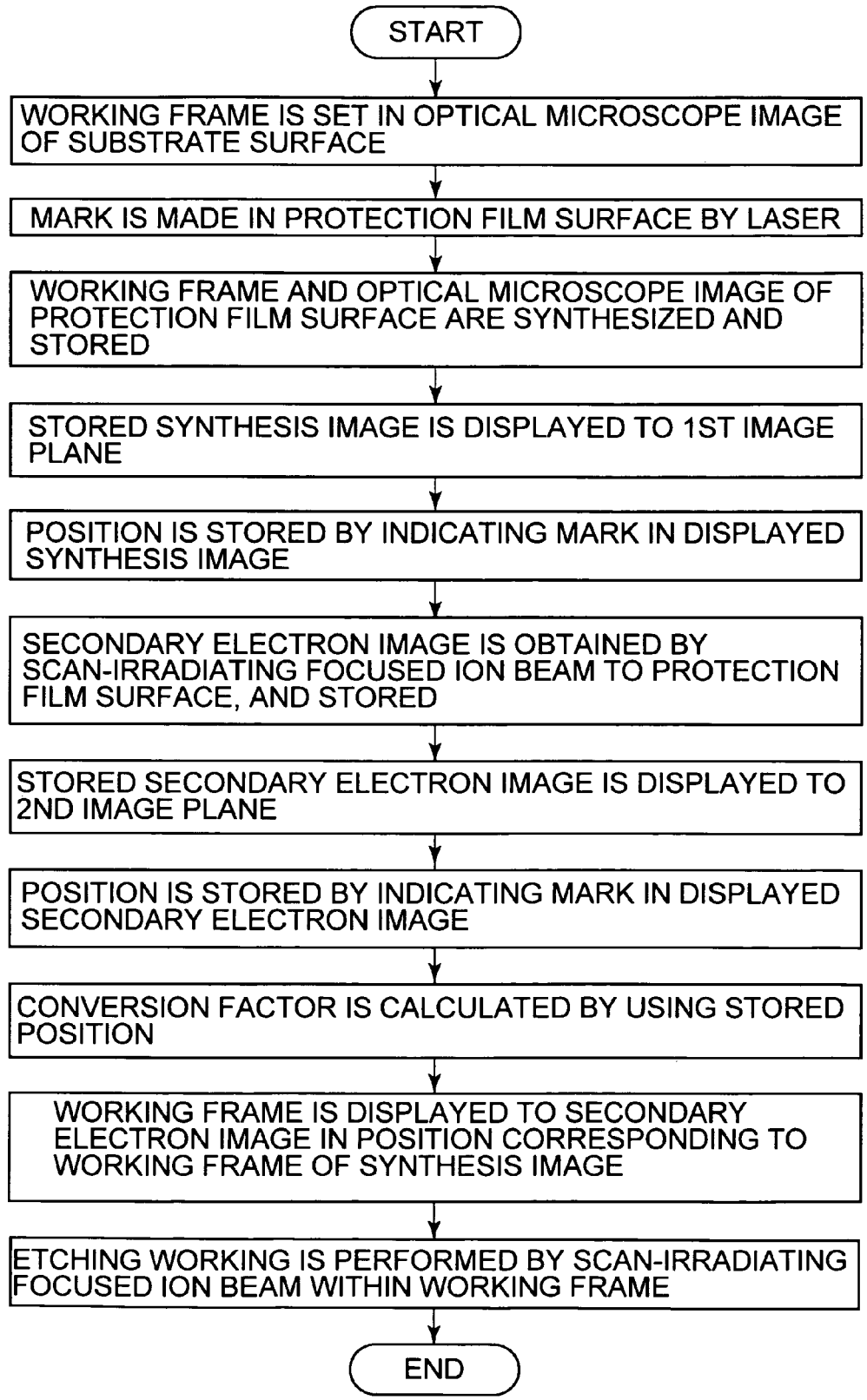

METHOD AND APPARATUS FOR SPECIFYING WORKING POSITION ON A SAMPLE AND METHOD OF WORKING THE SAMPLE

BACKGROUND OF THE INVENTION

The present invention relates to a method of and an apparatus for specifying an observing or working position which specify, as to a position indicated by an electronic or digitized data of a sample a corresponding position by an observation image of the sample, and to a method and an apparatus for working a sample.

As a method of performing an observation or working of the sample by a scanning charge particle microscope, an optical microscope and the like, there is the fact that the observation or working is performed by the scanning charged particle microscope, the optical microscope and the like by indicating a desired observing or working position by using the observation image obtained by other observation apparatus and a layout drawing of the sample or, in the sample such as semiconductor device, a CAD data of the sample.

For example, in a case where the observation of the sample is performed by a charged particle beam apparatus, a secondary electron image obtained by scan-irradiating a charged particle beam to the sample is an image mainly resulting from a step of a sample surface. Accordingly, the observation of the sample whose surface is flat or a portion existing in a lower layer of the sample comprising a multi-layer structure cannot be displayed to the secondary electron image. Whereupon, as a method of observing the semiconductor device having a layer structure, there is disclosed a method of determining the observing position by a synthesized image by image-synthesizing the secondary electron image of a surface of the semiconductor device and an image of a design data by using the design data of the semiconductor device (for example, refer to Patent Document 1).

Further, as a method of working the semiconductor device having the layer structure, there is disclosed a method of working by a focused ion beam by forming a mark in the vicinity of the working position, measuring a relative distance between the mark and the working position by the optical microscope, and indicating the working position by referring to a measurement result and a position of the mark (for example, refer to Patent Document 2).

[Patent Document 1] JP-A-9-147780 Gazette
[Patent Document 2] JP-A-10-303199 Gazette However, in the method of determining the observing position by image-synthesizing the secondary electron image of the surface of the semiconductor device and the image of the design data, in order to image-synthesize, it has been necessary to coincide a magnification of the secondary electron image with that of the design data. On that occasion, a magnification accuracy of the charged particle beam apparatus influences a position specifying accuracy, so that it has been difficult to accurately specify the observing position. Further, since image-synthesized, a time has been required.

Further, in the method of specifying the worked position from the measurement result by forming the mark in the vicinity of the worked position, and measuring the relative distance between the mark and the worked position by the optical microscope, since the worked position is determined on the basis of the relative distance measured by the optical microscope, a measurement accuracy of the optical microscope influences a working position specifying accuracy, so that it has been difficult to accurately specify the working position.

The present invention attempts to solve the foregoing problems with the conventional method and apparatus, and an object is to accurately and simply specify the observing or working position.

SUMMARY OF THE INVENTION

In order to achieve the above object, the present invention provides various techniques which are mentioned below.

A method of specifying an observing or working position of the present invention is one characterized by comprising a process of taking-in and storing an electronic or digitized data of a sample to a 1st storage means, a process of displaying an image of a portion, which contains a desired observing or working position among the stored electronic data of the sample, to a 1st image plane, a process of indicating on the 1st image plane a 1st position by a pointing device, thereby storing it to a 2nd storage means, a process of obtaining an observation image by moving the sample to the observing position so as to be capable of observing the desired observing or working position, thereby storing the observation image to a 3rd storage means, a process of displaying the stored observation image to a 2nd image plane, a process of indicating by the pointing device a position, on the 2nd image plane, corresponding to the 1st position stored in the 2nd storage means, thereby storing it to a 4th storage means, a process of calculating a conversion function for converting a coordinate system of the 1st image plane and that of the 2nd image plane by using the position stored in the 2nd storage means and the position stored in the 4th storage means, a process of indicating a 2nd position in any one image plane of the 1st image plane and the 2nd image plane, and a process of specifying a position corresponding to the 2nd position in the other image plane by the conversion function.

Further, a 2nd problem resolution means is to use a method of specifying an observing or working position according to a 1st problem resolution means, wherein the 1st position is plural points.

Further, a 3rd problem resolution means is to use a method of specifying an observing or working position according to the 1st problem resolution means, wherein the 1st position is plural lines.

Further, a 4th problem resolution means is to use a method of specifying an observing or working position according to the 1st problem resolution means, wherein the 1st position is one or more region(s).

Further, a 5th problem resolution means is to use a method of specifying an observing or working position according to the 1st problem resolution means, wherein the process of indicating a 2nd position in any one image plane of the 1st image plane and the 2nd image plane is a process of indicating the 2nd position in the 1st image plane.

Further, a 6th problem resolution means is to use a method of specifying an observing or working position according to the 1st problem resolution means, wherein the process of indicating a 2nd position in any one image plane of the 1st image plane and the 2nd image plane is a process of indicating the 2nd position in the 2nd image plane.

Further, a 7th problem resolution means is to use a method of specifying an observing or working position according to the 1st problem resolution means, wherein an indication of the 2nd position and a specification of the corresponding position use the pointing device.

Further, an 8th problem resolution means is to use a method of specifying an observing or working position according to the 1st problem resolution means, wherein the observation image is a secondary charged particle image obtained from secondary charged particles by scan-irradiating a charged particle beam to a surface of the sample and detecting the secondary charged particles generated from the surface of the sample.

Further, a 9th problem resolution means is to use a method of specifying an observing or working position according to the 1st problem resolution means, wherein the observation image is an optical microscope image of the sample.

Further, a 10th problem resolution means is to use a method of specifying an observing or working position according to the 1st problem resolution means, wherein the observation image is a scanning probe microscope image of the sample.

Further, an 11th problem resolution means is to use a method of specifying an observing or working position according to the 1st problem resolution means, wherein the electronic data is a CAD data.

Further, a 12th problem resolution means is to use a method of specifying an observing or working position according to the 1st problem resolution means, wherein the electronic or digitized data is digitized data of a layout drawing.

Further, a 13th problem resolution means is to use a method of specifying an observing or working position according to the 1st problem resolution means, wherein the electronic or digitized data is digitized data of an optical microscope image.

Further, a 14th problem resolution means is to use a method of specifying an observing or working position according to the 1st problem resolution means, wherein the electronic or digitized data is digitized data of a secondary charged particle image.

Further, a 15th problem resolution means is to use a method of working a sample, characterized by containing a process of working by scan-irradiating a charged particle beam to the position specified by a method of specifying an observing or working position according to the 8th problem resolution means.

Further, a 16th problem resolution means is to use a method of working a sample, characterized by containing a process of working by scanning a probe to the position specified by a method of specifying an observing or working position according to the 10th problem resolution means.

Further, a 17th problem resolution means is to use an apparatus for specifying an observing or working position, characterized by comprising a 1st storage means for taking-in and storing an electronic data of a sample, a 1st image plane for displaying an image of a portion, which contains a desired observing or working position among the stored electronic data of the sample, a 2nd storage means for storing a 1st position that a pointing device has indicated on the 1st image plane, a sample stage control means for moving the sample to the observing position so as to be capable of observing the desired observing or working position, a 3rd storage means for storing an observation image of the sample, a 2nd image plane for displaying the stored observation image, a 4th storage means for storing a position, on the 2nd image plane, corresponding to the 1st position stored in the 2nd storage means, a 1st calculation means for calculating a conversion function for converting a coordinate system of the 1st image plane and that of the 2nd image plane by using the position stored in the 2nd storage means and the position stored in the 4th storage means, and a 2nd calculation means for indicating a 2nd position in any one image plane of the 1st image plane and the 2nd image plane, thereby calculating a position corresponding to the 2nd position in the other image plane by the conversion function.

Further, an 18th problem resolution means is to use, in an apparatus for specifying an observing or working position according to the 17th problem resolution means, an apparatus for specifying an observing or working position, wherein an indication of the desired position and a specification of the corresponding position possess a 3rd calculation means for displaying the pointing device.

Further, a 19th problem resolution means is to use, in an apparatus for specifying a position according to the 17th or 18th problem resolution means, an apparatus for working a sample, wherein there is possessed a control means for scan-irradiating a charged particle beam to the calculated position.

Further, a 20th problem resolution means is to use a method of working a sample, comprising a process of indicating a working frame to a desired working position in an optical microscope image of the sample, a process of irradiating a laser beam to a periphery of the working frame to thereby form a mark, a process of storing the optical microscope image containing the working frame and the mark, a process of displaying the stored optical microscope image to a 1st image plane, and indicating a position of the mark by a pointing device to thereby store it to a 2nd storage means, a process of scan-irradiating a charged particle beam to a region containing the working frame and the mark to thereby obtain a secondary electron image and store it to a 3rd storage means, a process of displaying the obtained secondary electron image to a 2nd image plane, a process of indicating the position of the mark in the 2nd image plane by the pointing device to thereby store it to a 4th storage means, a process of calculating a conversion function for converting a coordinate system of the 1st image plane and that of the 2nd image plane by using the position stored in the 2nd storage means and the position stored in the 4th storage means, a process of displaying the working frame, of the 2nd image plane, corresponding to that displayed in the 1st image plane by using the calculated conversion function, and a process of scan-irradiating the charged particle beam to the working frame of the 2nd image plane to thereby etching-work it.

Further, a 21st problem resolution means is to use an apparatus for working a sample, characterized by comprising an apparatus for working a sample according to the 19th problem resolution means, and an optical microscope possessing a laser beam irradiation system capable of irradiating a laser beam to the sample.

An action by the above 1st problem resolution means is as follows. By indicating a 2nd position in any one image plane of the 1st image plane and the 2nd image plane and specifying a position corresponding to the 2nd position in the other image plane by the conversion function, it is possible to specify a position, in the other image plane, corresponding to the 2nd position indicated in the any one image plane.

An action by the above 7th problem resolution means is as follows. By the fact that an indication of the desired position and an specification of the corresponding position use the pointing device, if the 2nd position in any one image plane of the 1st image plane and the 2nd image plane is indicated by the pointing device, it is possible to display the pointing device indicating the corresponding position in the other image plane.

An action by the above 15th problem resolution means is as follows. By working by scan-irradiating the charged particle beam to a position specified by a method of specifying an observing or working position according to any of the 8th problem resolution means, it is possible to work the working position, in the other image plane, corresponding to the desired working position indicated in any one image plane of the 1st image plane and the 2nd image plane.

An action by the above 20th problem resolution means is as follows. By forming the mark by the laser beam, it is possible to specify the observing and working positions even for the sample in which the 1st position cannot be confirmed by the secondary charge particle image.

As mentioned above, according to a method of and an apparatus for specifying an observing or working position and a method of and an apparatus for working a sample of the present invention, by calculating the conversion function for converting the coordinate system of the image of the portion containing the desired observing or working position in the electronic data of the sample and that of the observation image, since it is possible to indicate the desired observing or working position in any one image and specify the corresponding position in the other image by the above conversion function, it is possible to accurately and simply specify the observing or working position without depending on the magnification accuracy and the measurement accuracy of the charge particle beam apparatus and the optical microscope apparatus or the scanning probe microscope.

Further, by using the pointing device for the indication of the desired position and the specification of the corresponding position in the above method of specifying an observing or working position, it is possible to accurately and simply specify the observing or working position.

Additionally, since the position specified by the above method of specifying an observing or working position can be worked by the charged particle beam, it is possible to accurately and simply specify the working position to thereby work by the charge particle beam.

Further, it is possible to perform also the working of an inside, of the sample, not capable of being observed by the secondary charged particle image by the charged particle beam or the scanning probe microscope image.

Further, by forming the mark by the laser beam, the observing and working positions can be specified even in the sample in which the 1st position cannot be confirmed by the secondary charged particle image.

BRIEF DESCRIPTION OF THE DRAWINGS

FIG. 6 is a flowchart showing the embodiment of the present invention

DETAILED DESCRIPTION OF THE PREFERRED EMBODIMENT

Hereunder, an embodiment of the present invention is explained on the basis of the drawings.

Concerning the semiconductor device having the layer structure, by referring to FIG. 1, FIGS. 2A-2B and FIG. 3 it is explained about a method of specifying a position on a sample using CAD data.

Figure 1:
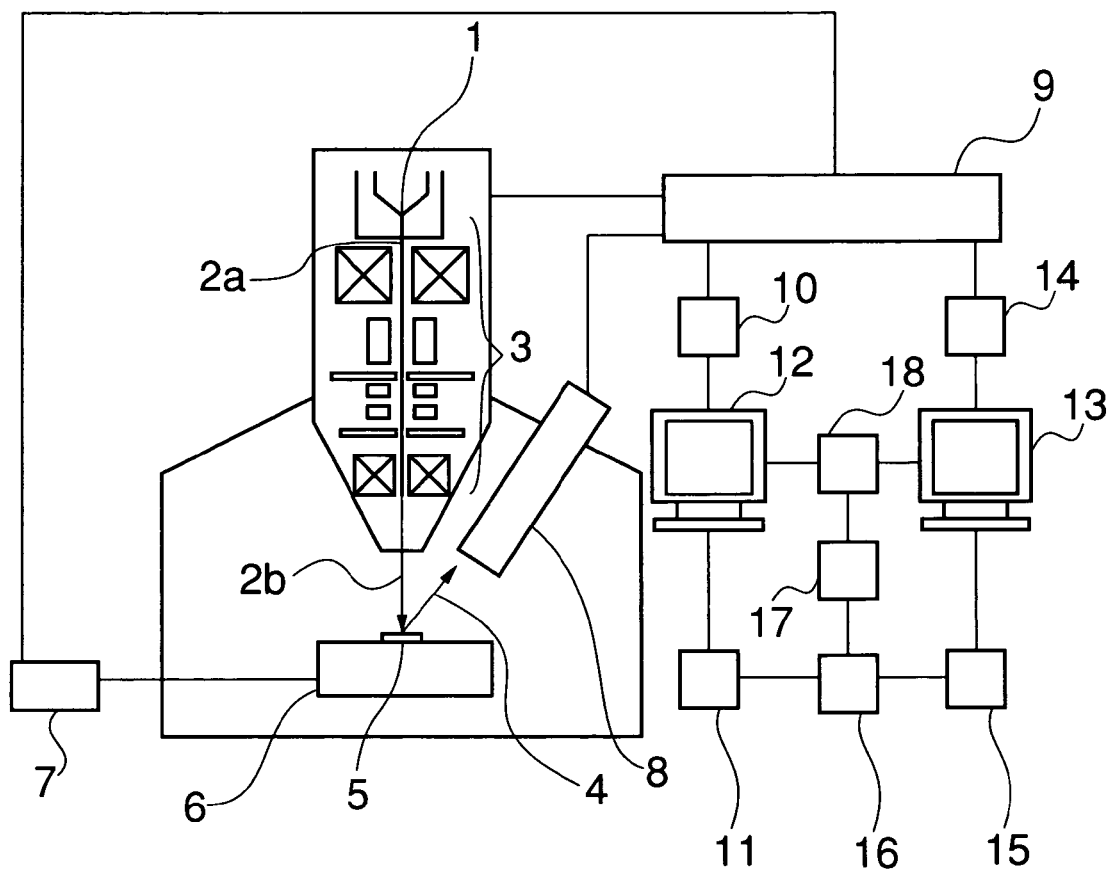
FIG. 1 is a schematic diagram of an electron beam apparatus, which shows an embodiment of the present invention
Figure 2A:
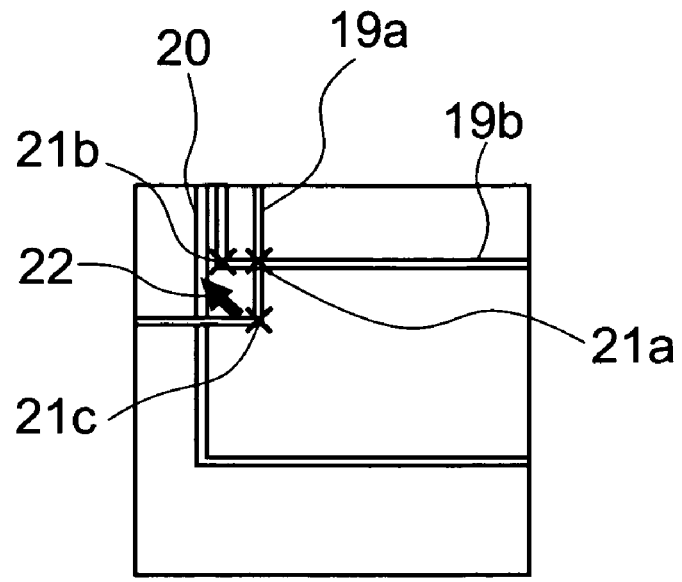
FIG. 2A is a schematic depiction showing an image of a CAD data.
Figure 2B:
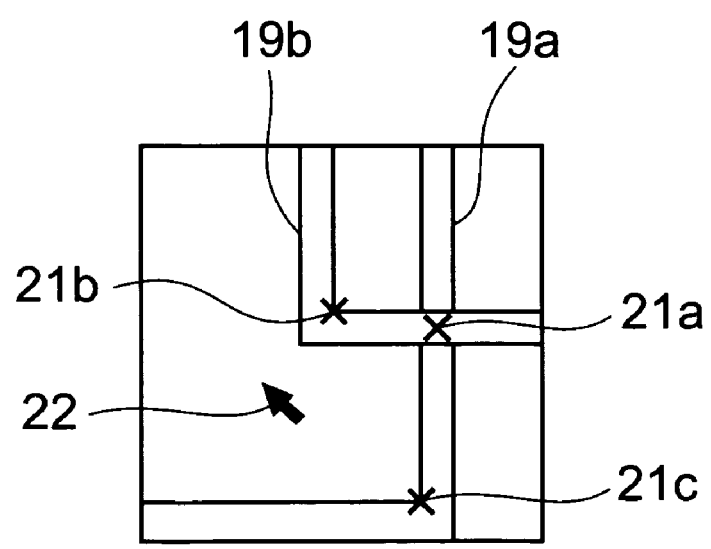
FIG. 2B is schematic depiction showing a secondary electron image
Figure 3:
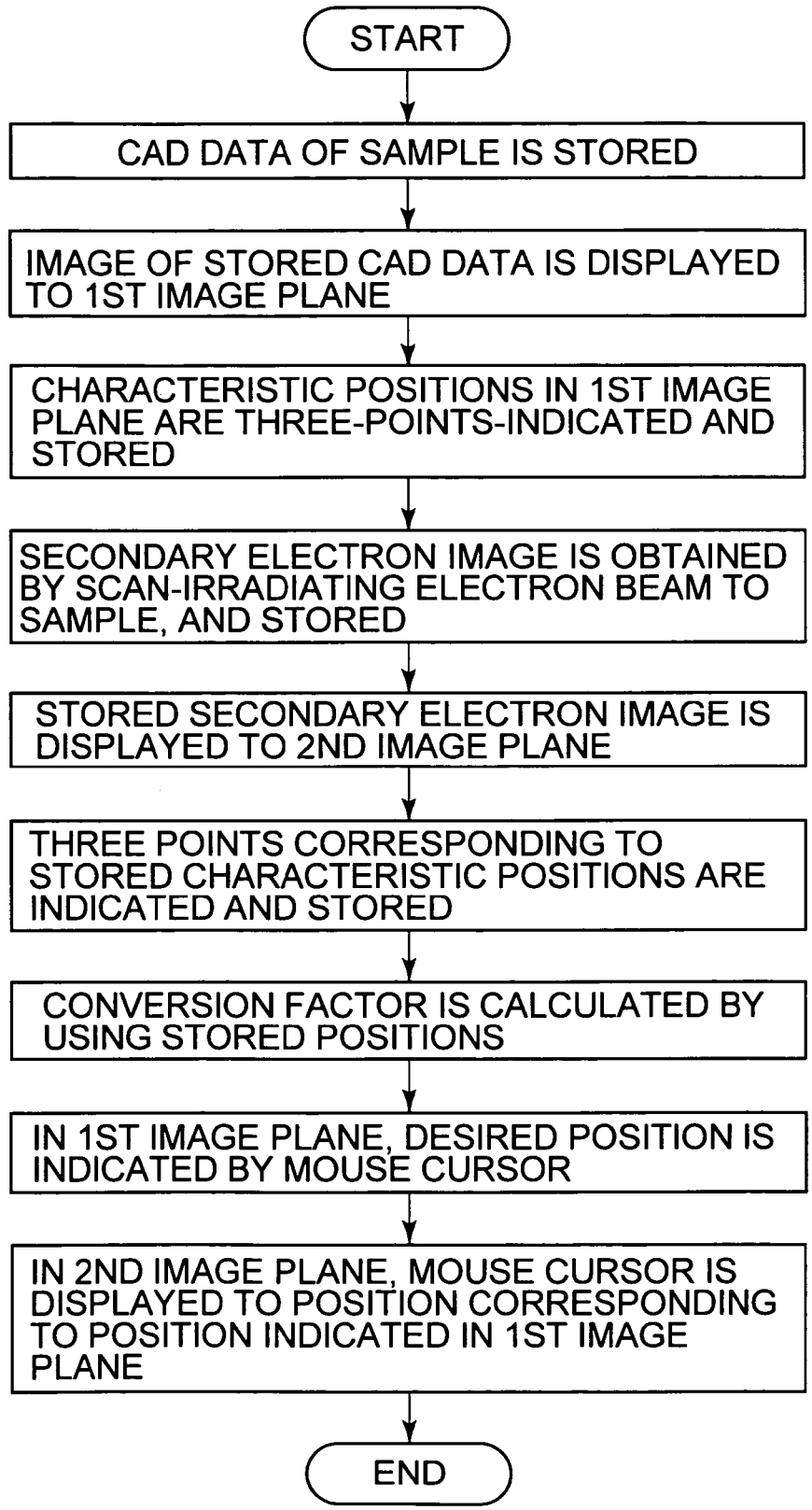
FIG. 3 is a flowchart showing the embodiment of the present invention

FIG. 1 is a schematic diagram of an electron beam apparatus, which shows the embodiment of the present invention. It is explained in accordance with a flowchart of FIG. 3 showing the embodiment of the present invention. First, the CAD data is taken to a 1st storage means 10 as electronic or digitized data of a sample 5, and stored. Next, an image of a portion containing a desired observing position is displayed to a 1st image plane or display area (e.g., a display screen) 12 by the stored electronic data of the sample 5. FIGS. 2A-2B are sample schematic depictions showing the embodiment of the present invention, and FIG. 2A is an image, of the CAD data, displayed in the 1st image plane 12. 19$a$, 19$b$ are wirings of a surface, and 20 is a wiring of a lower layer. Next, by using a mouse cursor 22 as a pointing device, three points of positions 21$a$, 21$b$, 21$c$ are indicated by the mouse cursor 22 as a 1st position in FIG. 2A, and the indicated 1st position is stored to a 2nd storage means 11. However, the three points of the positions 21$a$, 21$b$, 21$c$ are made so as not to be arranged on the same straight line. Here, it suffices if the position indicated by the mouse cursor is one becoming an aggregation of plural points, such as plural lines or regions, instead of the plural points like the above. In other words, it suffices if it is one becoming a coordinate information of the 1st image plane 12, which becomes necessary when finding a conversion factor for converting a coordinate system of the 1st image plane 12 into that of other image plane. Next, an electron beam 2$b$ is formed by finely converging electrons 2$a$ generated in an electron generating source 1 by an electron optical system 3, and it is scan-irradiated to the sample 5 installed onto a sample stage 6 having been moved to an observing position by a sample stage controlling means 7. Secondary electrons 4 generated by irradiating the electron beam 2$b$ to the sample 5 is detected by a secondary electron detector 8. An observation image, of the sample 5, obtained from the detected secondary electrons is stored to a 3rd storage means 14. A stored secondary electron image is displayed to a 2nd image plane or display area (e.g., display screen) 13. Further, FIG. 2B is the secondary electron image, of the sample 5 surface, displayed to the 2nd image plane 13. Since the secondary electron image becomes an image resulting mainly from the step of the surface, the wiring 20 of the lower layer is displayed in the CAD data of FIG. 2A, but it cannot be displayed in the secondary electron image of FIG. 2B. Here, in FIG. 1, although the 1st image plane 12 and the 2nd image plane 13 are depicted as the image planes of different displays, the 1st image plane and the 2nd image plane may be displayed to the same display. Subsequently, the three points of the positions 21$a$, 21$b$, 21$c$ which correspond in FIG. 2B displayed to the 2nd image plane 13 and correspond to the three points of the positions 21$a$, 21$b$, 21$c$ of the CAD data image, of FIG. 2A, displayed to the 1st image plane 12 are indicated by the mouse cursor 22, and a position indicated in the 2nd image plane 13 is stored in a 4th storage means 15. Next, in a 1st calculation means 16 for calculating the conversion factor or function for converting the coordinate system of the 1st image plane 12 into that of the 2nd image plane 13 is calculated by using the positions stored in the 2nd storage means 11 for storing the 1st position indicated in the 1st image plane 12 and the 4th storage means 15 for storing the position indicated in the 2nd image plane. Next, in FIG. 2A, a desired observing position is indicated as a 2nd position by the mouse cursor 22. Thereupon, in a 2nd calculation means 17 for calculating a corresponding position from the calculated conversion factor, there is calculated a position in the secondary electron image, of FIG. 2B, displayed in the 2nd image plane 13, which corresponds to the position that the mouse cursor 22 has indicated in the CAD data image, of FIG. 2A, displayed in the 1st image plane 12. And, it is possible to display the mouse cursor 22 to a position calculated by a 3rd calculation means 18 displaying the mouse cursor to the corresponding position. Like this, it is possible to display the position in the secondary electron image, of FIG. 2B, displayed in the 2nd image plane 13 corresponding to the position indicated by a CAD data image, of FIG. 2A, displayed in the 1st image plane 12.

Like the above, according to the present invention, it is possible to accurately perform an observing position specification without undergoing an influence by the magnification accuracy of the electron beam apparatus. Further, in FIG. 2B, it is also possible to calculate the position, of FIG. 2A, corresponding to the indicated position by indicating the desired position by the mouse cursor 22. In other words, it is possible to simply and accurately perform the specification of the position between the 1st image plane 12 and the 2nd image plane 13.

Next, concerning the semiconductor device having a transparent protection film, by referring to FIGS. 4A-4B, FIGS. 5A-5B and FIG. 6, it is explained about a method of specifying and working a position by using an optical microscope image.

Figure 4A:
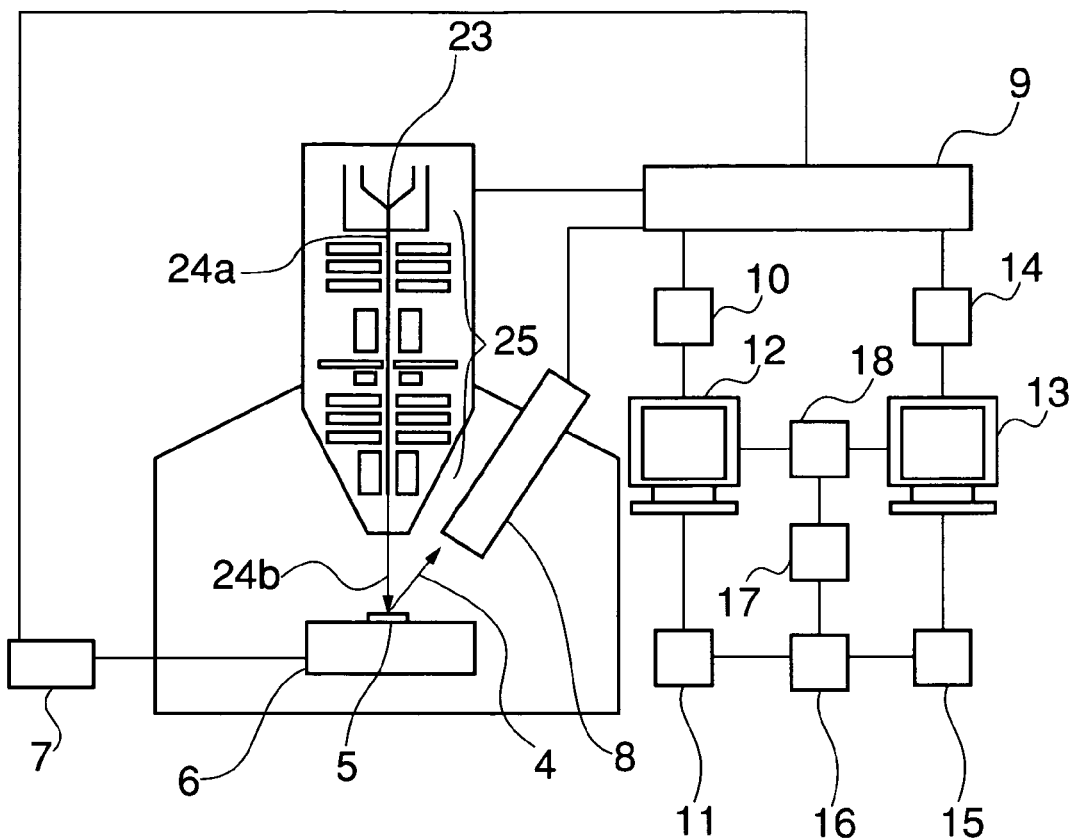
FIG. 4A is a schematic diagram of a focused ion beam apparatus, which shows the embodiment of the present invention.
Figure 4B:
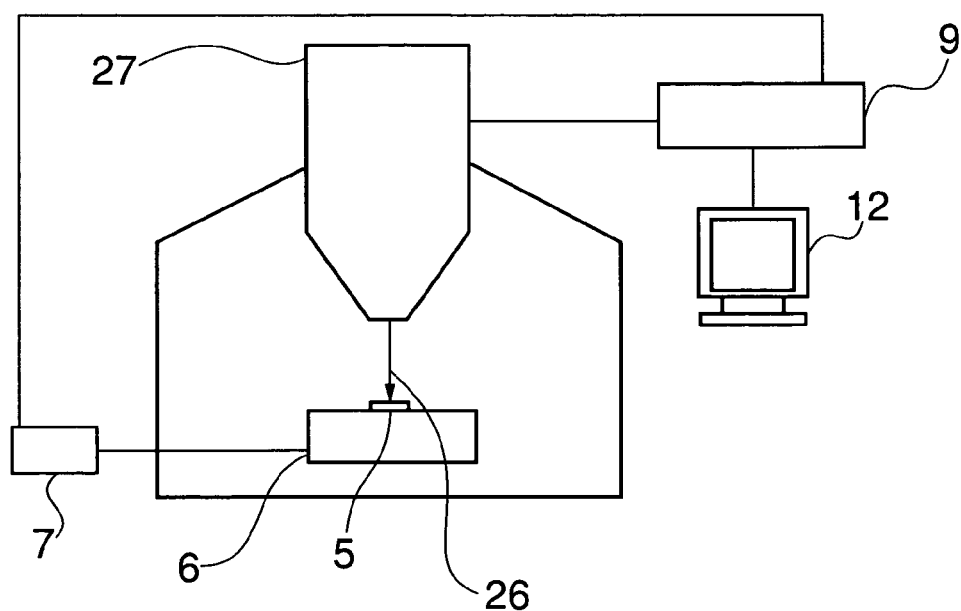
FIG. 4B is a schematic diagram of an optical microscope apparatus possessing a laser beam irradiation system, which shows the embodiment of the present invention
Figure 5A:
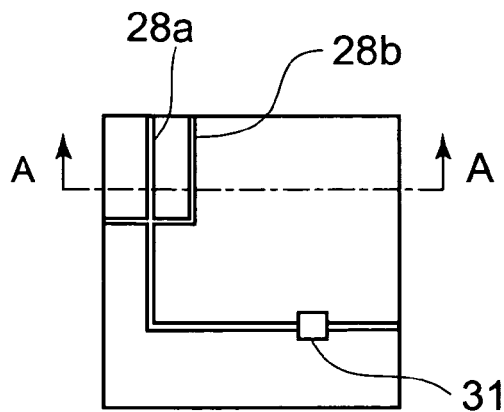
FIG. 5A is an optical microscope image of a sample surface.
Figure 5B:
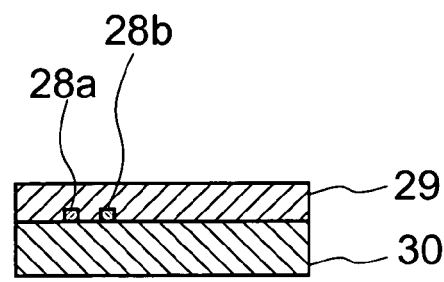
FIG. 5B is an A-A sectional view of FIG. 5A.
Figure 5C:
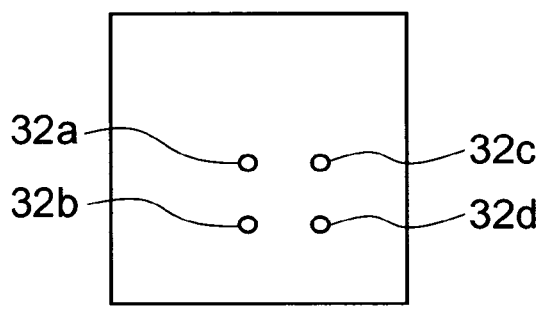
FIG. 5C is an optical microscope image of the surface of protection layer.
Figure 5D:
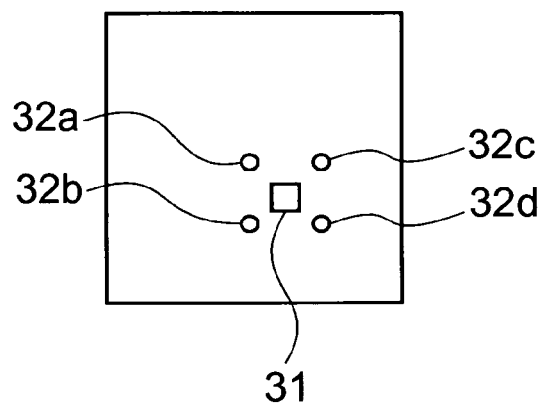
FIG. 5D is a synthesis image.
Figure 5E:
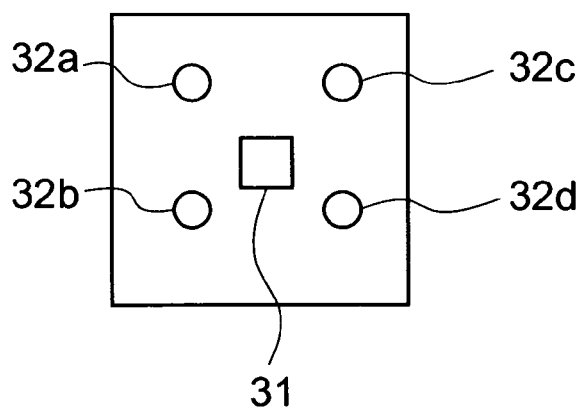
FIG. 5E is a secondary electron image

FIG. 4A is a schematic diagram of a focused ion beam apparatus, which shows the embodiment of the present invention. Further, FIG. 4B is a schematic diagram of an optical microscope apparatus possessing a laser beam irradiation system, which shows the embodiment of the present invention. It is possible to irradiate a laser beam 26 to the sample 5 surface from an optical microscope lens-barrel 27 possessing the laser beam irradiation system. Further, it is also possible to obtain the optical microscope image of the sample 5 by the optical microscope lens-barrel 27 possessing the laser beam irradiation system. FIGS. 5A-5E are sample schematic depictions showing the embodiment of the present invention, and FIG. 5B is an A-A sectional view of FIG. 5A wherein wirings 28a, 28b are disposed on a substrate 30 and thereon there is deposited a transparent protection film 29. It is explained in accordance with a flowchart of FIG. 6 showing the embodiment of the present invention. First, the optical microscope image FIG. 5A focused to a surface of the substrate 30 of the sample 5 is obtained by the optical microscope lens-barrel 27 possessing the laser beam irradiation system, and a desired working frame 31 is set. Subsequently, marks 32a, 32b, 32c, 32d are made by irradiating the laser beam 26 to the protection film 29 surface. Next, an observation is performed by adapting a focus of the optical microscope lens-barrel 27 possessing the laser beam irradiation system to the surface of the protection film 29. FIG. 5C is the optical microscope image observed with the focus being adapted to the surface of the protection film 29, and the marks 32a, 32b, 32c, 32d have been made on the protection film 29. Next, the working frame 31 displayed in FIG. 5A is synthesized with FIG. 5C, thereby obtaining a synthesis image of the working frame 31 and the protection film 29 surface displaying the marks 32a, 32b, 32c, 32d like FIG. 5D. The obtained synthesis image is made an electronic data of the sample 5, and the electronic data of the sample 5 is stored to the 1st storage means 10. Next, the stored synthesis image is displayed to the 1st image plane 12. Subsequently, four points of the marks 32a, 32b, 32c, 32d are indicated in FIG. 5D by the mouse cursor, and positions indicated in the 1st image plane 12 are stored to the 2nd storage means 11. Next, ions 24a generated in an ion generating source 23 are finely converged by an ion optical system 25 to thereby form an ion beam 24b, and it is scan-irradiated to the sample 5. A control of the ion beam is being performed by a control means 9. The secondary electrons 4 generated by irradiating the ion beam 24b to the sample 5 is detected by the secondary electron detector 8. The observation image, of the sample, obtained from the detected secondary electrons is stored to the 3rd storage means 14. The stored secondary electron image is displayed to the 2nd image plane 13. Here, since the secondary electron image becomes the image resulting mainly from the step of the surface, wirings 28a, 28b cannot be displayed. Next, four points of the marks 32a, 32b, 32c, 32d in the displayed secondary image are indicated by the mouse cursor, and the positions indicated in the 2nd image plane are stored to the 4th storage means 15. In the 1st calculation means 16 for calculating the conversion factor, the conversion factor for converting the coordinate system of the 1st image plane 12 into that of the 1st image plane 13 is calculated by using the positions stored in the 2nd, storage means 11 for storing the position indicated in the 1st image plane 12 and the 4th storage means 15 for storing the position indicated in the 2nd image plane 13. Thereupon, in the 2nd calculation means 17 for calculating a corresponding position from the calculated conversion factor, there is calculated a position of the working frame in the secondary electron image of the 2nd image plane, which is the synthesis image of the 1st image plane 12 and corresponds to the working frame 31 of FIG. 5D, and the working frame 31 is displayed to FIG. 5E, which is the secondary electron image of the 2nd image plane, by the 3rd calculation means 18. FIG. 5E is the secondary electron image of the protection film 29 surface and the marks 32a, 32b, 32c, 32d and the working frame 31 are displayed. And, by scan-irradiating the focused ion beam to the working frame 31, it is possible to perform an etching working.

Thus, as to the position indicated by the optical microscope, it is possible to accurately and simply perform the working position specification without undergoing an influence of the measurement accuracy of the optical microscope, thereby performing the working operation.

In the above embodiment, although the mouse cursor has been used as the pointing device, as an input means there may be used, besides the mouse, an input means for indicating the position on the image plane by a keyboard and the like or, besides the cursor, a display means such as working frame.

Further, in the above embodiment, as means for obtaining the observation image, although there has been used the charged particle beam apparatus such as electron beam and focused ion beam, besides there may be used an optical microscope apparatus and a scanning probe microscope apparatus. Further, as the working means, although there has been used the focused ion beam apparatus, besides it may be an excavation working which uses a scanning probe microscope.

Additionally, in the above embodiment, as the electronic data of the sample, although there have been used CAD data and digitized data of the optical microscope image, the data may be digitized data of a layout drawing, or digitized data of a secondary charged particle image.

Further, in the above embodiment, although it has been explained about the semiconductor device, the present invention is one bringing about advantages in the observing or working position specification and the working of various samples.

What is claimed is:

1. A method of specifying an observing or working position, comprising the steps of:
   providing as a sample a semiconductor device having first wirings on a surface of the semiconductor device and second wirings in a layer of the semiconductor device under the surface thereof;

taking-in and storing digitized data of the first and second wirings of the sample in a 1st storage means;

displaying on a 1st display area an image of the stored digitized data containing a desired observing or working position of the first and second wirings of the sample;

indicating on the 1st display area a 1st position on the first wirings using a pointing device and storing the 1st position in a 2nd storage means;

moving the sample to an observing or working position for observing a desired observing or working position of the sample;

obtaining an image of the surface of the sample in the observing or working position and storing the image in a 3rd storage means;

displaying on a 2nd display area the image stored in the 3rd storage means;

indicating on the 2nd display area a position corresponding to the 1st position stored in the 2nd storage means and storing the position corresponding to the 1st position in a 4th storage means;

calculating a conversion function for converting a coordinate system of the 1st display area and of the 2nd display area using the position stored in the 2nd storage means and the position stored in the 4th storage means;

indicating on the 1st display area the desired observing or working position of the second wirings; and specifying a position corresponding to the desired observing or working position of the second wirings on the 2nd display area in accordance with the calculated conversion function.

2. A method of specifying an observing or working position according to claim 1; wherein the 1st position comprises a plurality of points on the 1st display area.

3. A method of specifying an observing or working position according to claim 1; wherein the 1st position comprises a plurality of lines on the 1st display area.

4. A method of specifying an observing or working position according to claim 1; wherein the 1st position comprises one or more regions of the 1st display area.

5. A method of specifying an observing or working position according to claim 1; wherein the desired observing or working position is indicated and the position corresponding to the desired observing or working position is specified using the pointing device.

6. A method of specifying an observing or working position according to claim 1; wherein the observation image is a secondary charged particle image obtained by detecting secondary charged particles generated by scan-irradiating a charged particle beam on a surface of the sample.

7. A method of specifying an observing or working position according to claim 1; wherein the observation image is a scanning probe microscope image of the sample.

8. A method of specifying an observing or working position according to claim 1; wherein the digitized data is CAD data.

9. A method of specifying an observing or working position according to claim 1; wherein the digitized data is digitized data of a layout drawing.

10. A method of specifying an observing or working position according to claim 1; wherein the digitized data is digitized data of an optical microscope image.

11. A method of working a sample, comprising the steps of: specifying a working position of a sample according to the method of claim 6; and working the sample by scan-irradiating the specified working position with a charged particle beam.

12. A method of working a sample, comprising the steps of: specifying a working position of a sample according to the method of claim 7; and working the sample by scanning a probe on the specified working position.

13. An apparatus for specifying an observing or working position comprising:

1st storage means for taking-in and storing digitized data of first wirings on a surface of a sample as a semiconductor device and second wirings in a layer of the semiconductor device under the surface thereof;

a 1st display area for displaying an image of the digitized data stored in the 1st storage means containing a desired observing or working position of the first and second wirings;

2nd storage means for storing a 1st position indicated by a pointing device on the first wirings displayed on 1st display area;

control means for moving the sample to the observing or working position so as to be capable of observing the desired observing or working position;

3rd storage means for storing an observation image of the surface of the sample in the observing or working position;

a 2nd display area for displaying the stored observation image of the sample;

4th storage means for storing a position indicated on the 2nd display area corresponding to the 1st position stored in the 2nd storage means;

1st calculation means for calculating a conversion function for converting a coordinate system of the 1st display area and the 2nd display area using the 1st position stored in the 2nd storage means and the position stored in the 4th storage means; and 2nd calculation means for calculating in accordance with the calculated conversion function the desired observing or working position indicated in the 2nd display area corresponding to the observing or working position of the second wirings indicated in the 1st display area.

14. An apparatus for working a sample comprising: an apparatus for specifying an observing or working position according to claim 13; and means for scan-irradiating the specified observing or working position with a charged particle beam.

15. A method of working a sample comprising the steps of:

providing a sample having a surface covered with a transparent protection film;

positioning a working frame to a desired position under the transparent protection film in an optical microscope image of the sample;

irradiating the transparent protection film with a laser beam to form marks on a surface of the transparent protection film;

storing the optical microscope image containing the working frame and the marks in a 1st storage means;

displaying the stored optical microscope image on a 1st display area, indicating positions of the marks using a pointing device, and storing the positions in a 2nd storage means;

scan-irradiating a charged particle beam on a sample region containing the working frame and the marks to thereby obtain a secondary electron image and storing it in a 3rd storage means;

displaying the obtained secondary electron image on a 2nd display area;

indicating the positions of the marks on the 2nd display area using a pointing device and storing the positions in a 4th storage means;

calculating a conversion function for converting a coordinate system of the 1st display area and the 2nd display area using the positions stored in the 2nd storage means and the positions stored in the 4th storage means;

displaying in accordance with the calculated conversion function the working frame corresponding to the images displayed on the 1st display area and on the 2nd display area; and scan-irradiating the charged particle beam within the working frame of the 2nd display area to etch the sample.

16. An apparatus for working a sample according to claim 14; further comprising an optical microscope including a laser beam irradiation system that irradiates a laser beam on the sample.

17. A method of specifying an observing or working position according to claim 1; wherein each of the 1st and 2nd display areas comprises a display screen.

18. An apparatus for specifying an observing or working position according to claim 13; wherein each of the 1st and 2nd display areas comprises a display screen.

19. An apparatus for working a sample according to claim 14; wherein each of the 1st and 2nd display areas comprises a display screen.

20. A method of working a sample according to claim 15; wherein each of the 1st and 2nd display areas comprises a display screen.

* * * * *